US007046104B2

(12) United States Patent
Snyder et al.

(10) Patent No.: US 7,046,104 B2
(45) Date of Patent: *May 16, 2006

(54) CONTROLLING A TIME DELAY LINE BY ADDING AND REMOVING A FLUIDIC DIELECTRIC

(75) Inventors: Steven Robert Snyder, Palm Bay, FL (US); Stephen B. Brown, Palm Bay, FL (US); James J. Rawnick, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 94 days.

This patent is subject to a terminal disclaimer.

(21) Appl. No.: 10/361,548

(22) Filed: Feb. 10, 2003

(65) Prior Publication Data

US 2004/0155727 A1 Aug. 12, 2004

(51) Int. Cl.
*H03K 1/09* (2006.01)

(52) U.S. Cl. .................................. 333/205; 333/156

(58) Field of Classification Search ................ 333/156, 333/161, 205, 204; 361/277, 327, 255; 174/256, 174/255

See application file for complete search history.

(56) References Cited

U.S. PATENT DOCUMENTS 3,701,058 A * 10/1972 Smith ......................... 333/159
4,450,500 A * 5/1984 Wollenschlager ........... 361/277
5,162,872 A * 11/1992 Vanasse ...................... 356/519
5,808,241 A * 9/1998 Brooks ....................... 174/250
5,879,788 A * 3/1999 Fukuta et al. ............... 428/210
6,515,235 B1 * 2/2003 Moller ........................ 174/256

OTHER PUBLICATIONS

U.S. Appl. No. 10/369,436, filed Feb. 18, 2003, Rawnick et al.
U.S. Appl. No. 10/387,208, filed Mar. 11, 2003, Rawnick et al.
U.S. Appl. No. 10/330,755, filed Dec. 27, 2002, Rawnick et al.
U.S. Appl. No. 10/330,754, filed Dec. 27, 2002, Rawnick et al.
U.S. Appl. No. 10/300,456, filed Nov. 19, 2002, Rawnick et al.
U.S. Appl. No. 10/387,209, filed Mar. 11, 2003, Rawnick et al.
U.S. Appl. No. 10/387,194, filed Mar. 11, 2003, Brown et al.

(Continued)

*Primary Examiner*—Dinh T. Le
(74) *Attorney, Agent, or Firm*—Sacco & Associates, PA

(57) ABSTRACT

A variable true time delay line (100) includes an RF transmission line (110) and at least one fluidic delay unit (108). The fluidic delay unit includes a fluidic dielectric contained in a cavity (109) and coupled to the RF transmission line (110) along at least a portion of a length thereof. At least one pump is provided for adding and removing the fluid dielectric to the cavity (109) in response to a time delay control signal. A propagation delay of the RF transmission line is selectively varied by adding and removing the fluid dielectric from the cavity.

25 Claims, 4 Drawing Sheets

OTHER PUBLICATIONS

U.S. Appl. No. 10/438,435, filed May 15, 2003, Brown et al.
U.S. Appl. No. 10/414,696, filed Apr. 16, 2003, Brown et al.
U.S. Appl. No. 10/637,027, filed Aug. 7, 2003, Brown et al.
U.S. Appl. No. 10/414,650, filed Apr. 16, 2003, Brown et al.
U.S. Appl. No. 10/635,629, filed Aug. 6, 2003, Brown et al.
U.S. Appl. No. 10/459,067, filed Jun. 11, 2003, Brown et al.
U.S. Appl. No. 10/438,436, filed May 15, 2003, Rawnick et al.
U.S. Appl. No. 10/626,090, filed Jul. 24, 2003, Brown et al.
U.S. Appl. No. 10/635,582, filed Aug. 6, 2003, Rawnick et al.
U.S. Appl. No. 10/632,632, filed Aug. 1, 2003, Rawnick et al.
U.S. Appl. No. 10/614,149, filed Jul. 7, 2003, Brown et al.
U.S. Appl. No. 10/634,219, filed Aug. 5, 2003, Rawnick et al.
U.S. Appl. No. 10/458,859, filed Jun. 11, 2003, Rawnick et al.
U.S. Appl. No. 10/624,378, filed Jul. 22, 2003, Brown et al.
U.S. Appl. No. 10/438,433, filed May 15, 2003, Rawnick et al.
U.S. Appl. No. 10/460,947, filed Jun. 13, 2003, Rawnick et al.
U.S. Appl. No. 10/421,352, filed Apr. 23, 2003, Rawnick et al.
U.S. Appl. No. 10/409,261, filed Apr. 8, 2003, Pike.
U.S. Appl. No. 10/441,743, filed May 19, 2003, Pike.
U.S. Appl. No. 10/628,846, filed Jul. 28, 2003, Pike et al.
U.S. Appl. No. 10/300,455, filed Nov. 19, 2002, Brown et al.

* cited by examiner

CONTROLLING A TIME DELAY LINE BY ADDING AND REMOVING A FLUIDIC DIELECTRIC

STATEMENT REGARDING FEDERALLY SPONSORED RESEARCH OR DEVELOPMENT

The United States Government has rights in this invention pursuant to Contract No. NRO000-02-C-0388 between the National Reconnaissance Office and Harris Corporation.

BACKGROUND OF THE INVENTION

1. Statement of the Technical Field

The present invention relates to the field of delay lines, and more particularly to variable RF delay lines.

2. Description of the Related Art

Delay lines are used for a wide variety of signal processing applications. For example, broadband time delay circuits are used in beam-forming applications in phased array antennas. Typical fixed geometry, true time delay circuits used in phased array antennas are composed of switched lengths of transmission line. Despite the importance of broadband delay lines in such systems, the conventional approach to designing and implementing these components suffer from a number of drawbacks. For example, conventional delay line devices often require a relatively large number of RF switches that can result in signal losses. Also, conventional time delay circuits can be limited with regard to the delay resolution that can be achieved.

RF delay lines are often formed as ordinary transmission lines coupled to a dielectric. Depending upon the structure of the transmission line, the dielectric can be arranged in different ways. For example, microstrip and stripline circuits commonly are formed on a dielectric substrate. Two important characteristics of dielectric materials are permittivity (sometimes called the relative permittivity or $\epsilon_r$) and permeability (sometimes referred to as relative permeability or $\mu_r$). The relative permittivity and permeability determine the propagation velocity of a signal, which is approximately inversely proportional to $$\sqrt{\mu\varepsilon}.$$

The propagation velocity directly affects the electrical length of a transmission line and therefore the amount of delay introduced to signals that traverse the line.

Further, ignoring loss, the characteristic impedance of a transmission line, such as stripline or microstrip, is equal to $$\sqrt{L_l / C_l}$$

where $L_l$ is the inductance per unit length and $C_l$ is the capacitance per unit length. The values of $L_l$ and $C_l$ are generally determined by the permittivity and the permeability of the dielectric material(s) used to separate the transmission line structures as well as the physical geometry and spacing of the line structures. For a given geometry, an increase in dielectric permittivity or permeability necessary for providing increased time delay will generally cause the characteristic impedance of the line to change. However, this is not a problem where only a fixed delay is needed, since the geometry of the transmission line can be readily designed and fabricated to achieve the proper characteristic impedance.

When a variable time delay is needed, however, such techniques have traditionally been viewed as impractical because of the obvious difficulties in dynamically varying the permittivity and/or permeability of a dielectric board substrate material and/or dynamically varying transmission line geometries. Variable length lines have been implemented using mechanical means to vary the length of a line. These generally have involved an arrangement of telescoping tubes to produce a variable length coaxial line. These devices were at one time commonly used in laboratories for tuning circuits. However, these arrangements suffered from certain drawbacks. For example, they were subject to wear, difficult to control electronically, and are not easily scalable to microwave frequencies. Accordingly, the only practical solution has been to design variable delay lines using conventional fixed length RF transmission lines with delay variability achieved using a series of electronically controlled switches.

SUMMARY OF THE INVENTION

The invention concerns a variable true time delay line which includes an RF transmission line and at least one fluidic delay unit. The fluidic delay unit includes a fluidic dielectric contained in a cavity and coupled to the RF transmission line along at least a portion of a length thereof. At least one pump is provided for adding and removing the fluid dielectric to the cavity in response to a time delay control signal. A propagation delay of the RF transmission line is selectively varied by adding and removing the fluid dielectric from the cavity.

Considered in a broader context, the invention can consist of an RF transmission line, a fluidic dielectric, and at least one fluid control system for moving the fluid dielectric between a first position where the fluid dielectric is coupled to the RF transmission line, and a second position where the fluid dielectric is at least partially decoupled from the RF transmission line such that a propagation delay of the RF transmission line is varied when the fluid dielectric is moved from the first position to the second position.

According to one aspect of the invention, a plurality of fluidic delay units can be spaced apart along a length of the RF transmission line. According to another aspect of the invention, each of the fluidic delay units can be independently operable for selectively adding and removing the fluidic dielectric from the cavity of each respective unit. According to yet another aspect of the invention, the value of the fluidic dielectric permittivity and permeability can be selected for maintaining a relatively constant characteristic impedance along an entire length of the RF transmission line.

The RF transmission line can also be coupled to a solid dielectric substrate material. Consequently, the effective index describing the velocity of a wave on the RF transmission line can be varied by adding and removing the fluidic dielectric from the cavity. The solid dielectric substrate can be formed from a ceramic material. For example the solid dielectric substrate can be a low temperature co-fired ceramic. The permittivity and permeability of the fluidic dielectric can be different or the same as compared to the solid dielectric substrate. For example, the fluidic dielectric can have a permeability and a permittivity selected for maintaining a relatively constant characteristic impedance along the length of the RF transmission line.

The fluidic dielectric can be comprised of an industrial solvent. If higher permeability is desired, the industrial solvent can have a suspension of magnetic particles contained therein. The magnetic particles can be formed of a wide variety of materials including those selected from the group consisting of ferrite, metallic salts, and organo-metallic particles.

According to yet another aspect, the invention can include a method for producing a variable delay for an RF signal. The method can include the steps of dynamically adding and removing a fluidic dielectric to at least one cavity coupled to the RF transmission line in response to a time delay control signal to vary a propagation delay of the transmission line.

DETAILED DESCRIPTION OF THE INVENTION

Figure 1:
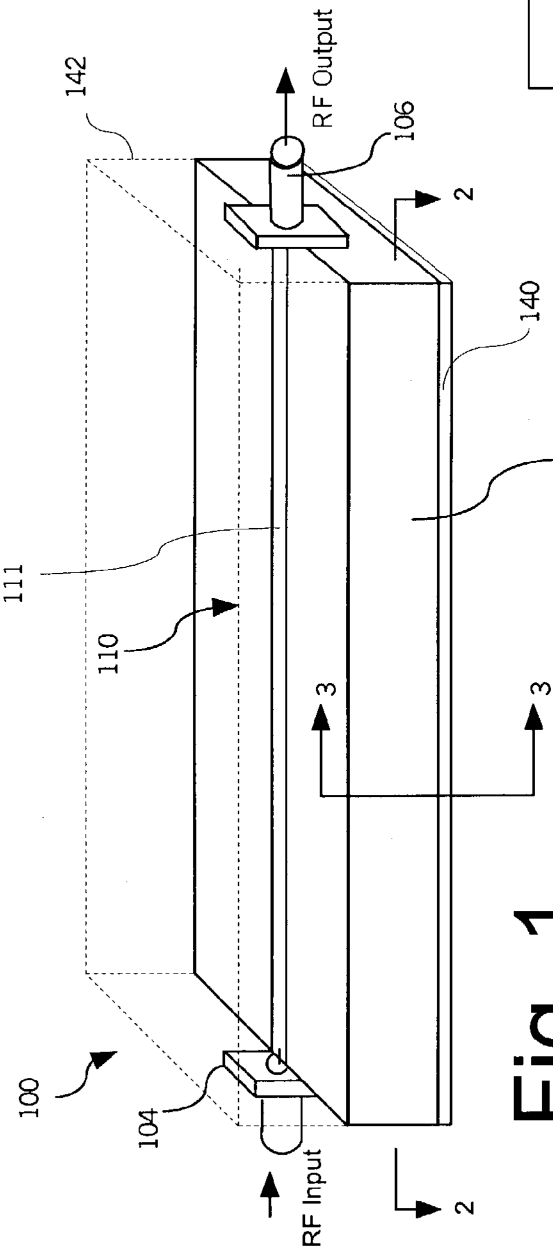
FIG. 1 is a perspective view of a variable delay line that is useful for understanding the invention.

FIG. 1 is a perspective view of a variable delay line that is useful for understanding the present invention. The delay line 100 includes an RF transmission line 110. The RF transmission line is comprised of a conductor 111 disposed on a substrate 102 positioned over a suitable ground plane 140. However, the invention is not limited to any particular type of transmission line. Instead, it should be understood that the invention as described herein can be used with any type of transmission line structure that can be coupled to a fluidic cavity as shall hereinafter be described in greater detail. RF input connector 104 and RF output connectors 106 can be provided for communicating RF signals to and from the variable delay line. However, the delay line can also be integrated onto a circuit board with other associated circuitry so as to avoid the need for such connectors.

Figure 3:
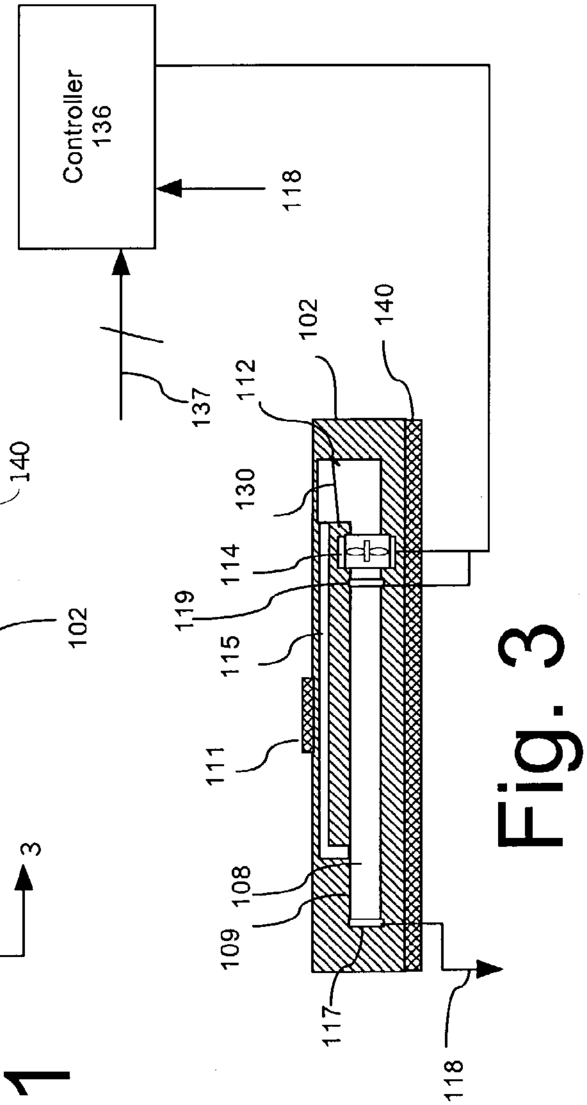
FIG. 3 is a cross-sectional view of the variable delay line in FIG. 1 taken along line 3—3.
Figure 2:
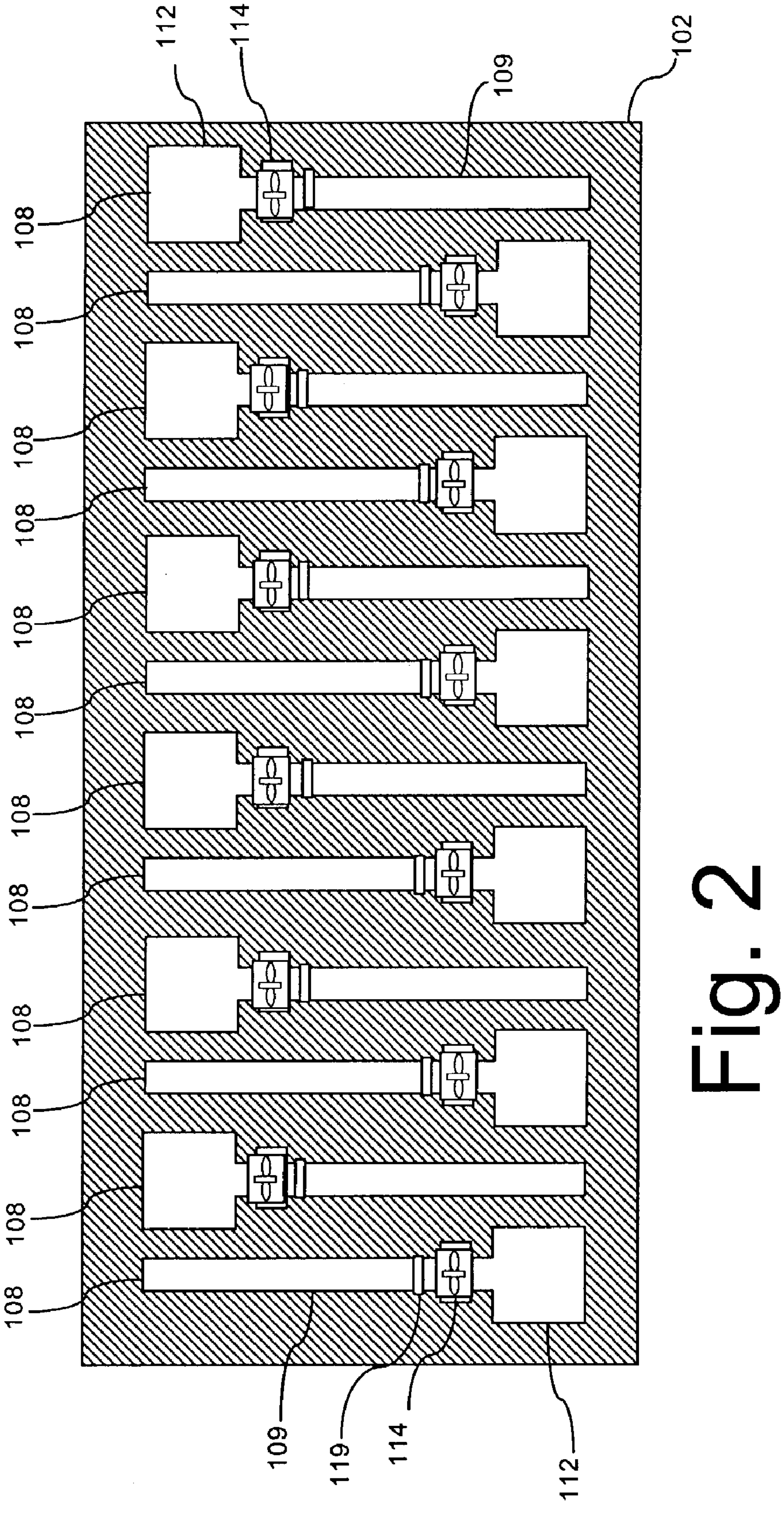
FIG. 2 is a cross-sectional view of the variable delay line in FIG. 1 taken along line 2—2.

Referring now to FIGS. 2 and 3, there is shown a cross-sectional view of the variable delay line taken along line 2—2 and 3—3, respectively, in FIG. 1. As shown in FIG. 3, a controller 136 is preferably provided for controlling operation of the variable delay line 100 in response to a control signal 137. The controller 136 can be in the form of a microprocessor with associated memory, a general purpose computer, or could be implemented as a simple look-up table.

Embedded within the substrate 102 are one or more fluidic delay units 108. As best shown in FIG. 3, each of the fluidic delay units 108 can be comprised of a cavity 109 and a reservoir 112 for containing a fluidic dielectric. A pressure relief conduit 115 can also be provided to facilitate the movement of the fluidic dielectric. The cavity 109 preferably extends adjacent to a region of the transmission line conductor 111 so that fluidic dielectric contained in the cavity can be electrically and magnetically coupled to the fields that are generated when RF signals are propagated along the transmission line. For example the cavity 109 can be positioned beneath the transmission line conductor 111 as shown in FIGS. 2 and 3.

For the purpose of introducing time delay, the exact size, location and geometry of the cavity 109 is not critical. The important factor for the purpose of introducing time delay is that the fluidic dielectric contained in the cavity 109 is sufficiently coupled to the RF transmission line so as to locally vary the propagation velocity of RF signals traversing along a portion of the length of the transmission line. However, in some instances, it may be desirable to avoid significant variations in the transmission line characteristic impedance along the length of the line. In that case the size, location and geometry of the cavity structure must be considered together with the permittivity and permeability characteristics of the fluidic dielectric.

According to one embodiment of the invention shown in FIGS. 2 and 3, each cavity structure 109 can be formed as an elongated channel traversing beneath transmission line conductor 111. Reservoir 112 is preferably positioned spaced apart from the transmission line conductor so as to minimize the effects of any coupling between magnetic and electric fields generated in the vicinity of conductor 111. A fluid control system is preferably interposed between the reservoir 112 and the cavity 109 so as to control the flow of fluidic dielectric between the two portions of each fluidic delay unit 108. Pressure relief conduit 115 allows any excess air or other gas to move freely between the cavity 109 and the reservoir 112.

The fluid control system can be any suitable arrangement of valves 119 and/or pumps 114 as may be necessary to independently adjust the relative amount of fluidic dielectric contained in the reservoir 112 and cavity 109. In FIGS. 2 and 3, a micro-electromechanical (MEMS) type valve 119 and pump 114 device are shown interposed between the cavity 109 and the reservoir 112 for this purpose. However, those skilled in the art will readily appreciate that the invention is not so limited. For example, MEMS type valves and/or larger scale pump and valve devices can also be used as would be recognized by those skilled in the art.

The fluid control system can cause the fluidic dielectric to completely or partially fill the cavity 109. The fluid control system can also cause the fluidic dielectric to be evacuated from cavity 109 into the reservoir 112. According to a preferred embodiment, each fluid control system 114 is preferably independently operable by controller 136 so that fluidic dielectric can be added or removed from selected ones of cavities 109 to produce the required amount of delay indicated by the control signal 137. Further, a sensor 107 can be provided for sensing a volume of fluid dielectric contained within the cavity 109. The sensor data 118 can be communicated back to the controller 136 to provide feedback information regarding the volume of fluid contained within the cavity 109.

Propagation delay of signals on transmission line 110 can also be controlled by selectively controlling the presence and removal of fluidic dielectric from the cavities 109 of selected ones of the fluidic delay unit 108. Since the propagation velocity of a signal is approximately inversely proportional to $\sqrt{\mu\epsilon}$, the different permittivity and/or permeability of the fluidic dielectric as compared to an empty cavity 109 will cause the propagation velocity (and therefore the amount of delay introduced)) to be different for signals on the portion of the transmission line coupled to the fluidic dielectric 130. By selectively varying the portions of the transmission line conductor 111 that are coupled to the first dielectric and the second dielectric, the total time delay of the transmission line 110 can be varied. Fine adjustments of the delay can be facilitated by adjusting the volume of fluid dielectric contained in individual cavities 109.

According to yet another embodiment of the invention, different ones of the fluidic delay units 108 can have different types of fluidic dielectric contained therein so as to produce different amounts of delay for RF signals traversing the transmission line 110. The different fluidic dielectrics can have differing electrical properties. For example, larger amounts of delay can be introduced by using fluidic dielectrics with proportionately higher values of permittivity and permeability. Using this technique, coarse and fine adjustments can be effected in the total amount of delay introduced.

According to a preferred embodiment, the permittivity and the permeability of the fluidic dielectric is selected so as to maintain a constant characteristic impedance for the transmission line 110 along its length. In general, this can be accomplished by maintaining an approximately constant ratio of permittivity to permeability. However, the invention is not so limited in that relatively small mismatches in impedance between portions of the line may be tolerable in certain applications.

Figure 4A:
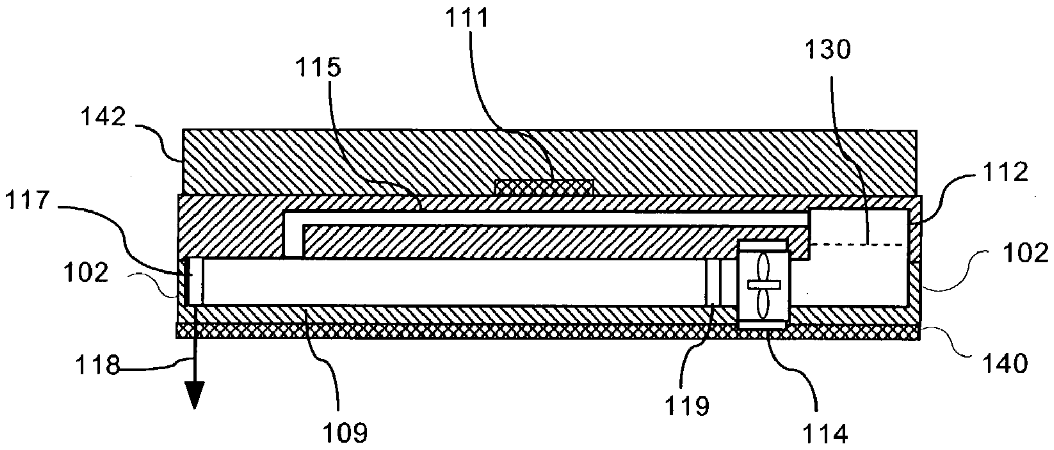
FIGS. 4*a* and 4*b* are cross-sectional views showing first and second alternative embodiments of the transmission line structure of FIG. 1.
Figure 4B:
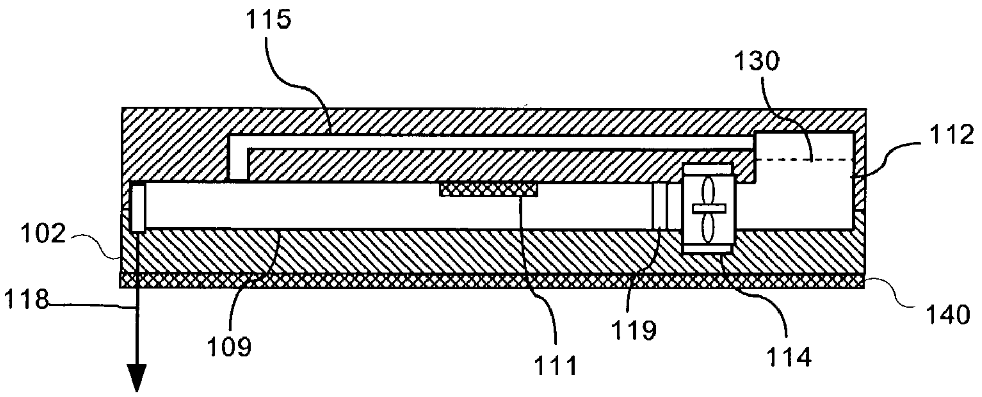

As previously noted, the invention is not limited to any particular type of transmission line structure. For example, in FIG. 1, an optional substrate layer 142 can be disposed over the conductor 111 to create a buried microstrip arrangement. Further, the position of the fluidic delay units 108 relative to the transmission line conductor 111 can be adjusted so that the transmission line conductor passes directly through the cavity 109. FIG. 4*a* is a cross-sectional view taken along line 3—3 showing the optional substrate layer 142. In a further alternative embodiment of the invention shown in FIG. 4*b*, the transmission line conductor 111 can pass be at least partially contained within the cavity 109.

Composition of the Fluidic Dielectric

The fluidic dielectric can be comprised of any fluid composition having the required characteristics of permittivity and permeability as may be necessary for achieving a selected range of delay. Those skilled in the art will recognize that one or more component parts can be mixed together to produce a desired permeability and permittivity required for a particular time delay and transmission line characteristic impedance. In this regard, it will be readily appreciated that fluid miscibility is a key consideration to ensure proper mixing of the component parts of the fluidic dielectric.

The fluidic dielectric 130 also preferably has a relatively low loss tangent to minimize the amount of RF energy lost in the delay line device. However, devices with higher insertion loss may be acceptable in some instances so this may not be a critical factor. Many applications also require delay lines with a broadband response. Accordingly, it may be desirable in many instances to select fluidic dielectrics that have a relatively constant response over a broad range of frequencies.

Aside from the foregoing constraints, there are relatively few limits on the range of materials that can be used to form the fluidic dielectric. Accordingly, those skilled in the art will recognize that the examples of suitable fluidic dielectrics as shall be disclosed herein are merely by way of example and are not intended to limit in any way the scope of the invention. Also, while component materials can be mixed in order to produce the fluidic dielectric as described herein, it should be noted that the invention is not so limited. Instead, the composition of the fluidic dielectric could be formed in other ways. All such techniques will be understood to be included within the scope of the invention.

Those skilled in the art will recognize that a nominal value of permittivity ($\epsilon_r$) for fluids is approximately 2.0. However, the fluidic dielectric 130 used herein can include fluids with higher values of permittivity. For example, the fluidic dielectric material could be selected to have a permittivity values of between 2.0 and about 58, depending upon the amount of delay required.

Similarly, the fluidic dielectric 130 can have a wide range of permeability values. High levels of magnetic permeability are commonly observed in magnetic metals such as Fe and Co. For example, solid alloys of these materials can exhibit levels of $\mu_r$, in excess of one thousand. By comparison, the permeability of fluids is nominally about 1.0 and they generally do not exhibit high levels of permeability. However, high permeability can be achieved in a fluid by introducing metal particles/elements to the fluid. For example typical magnetic fluids comprise suspensions of ferro-magnetic particles in a conventional industrial solvent such as water, toluene, mineral oil, silicone, and so on. Other types of magnetic particles include metallic salts, organo-metallic compounds, and other derivatives, although Fe and Co particles are most common. The size of the magnetic particles found in such systems is known to vary to some extent. However, particles sizes in the range of 1 nm to 20 μm are common. The composition of particles can be selected as necessary to achieve the required permeability in the final fluidic dielectric. Magnetic fluid compositions are typically between about 50% to 90% particles by weight. Increasing the number of particles will generally increase the permeability.

More particularly, a hydrocarbon dielectric oil such as Vacuum Pump Oil MSDS-12602 could be used to realize a low permittivity, low permeability fluid, low electrical loss fluid. A low permittivity, high permeability fluid may be realized by mixing same hydrocarbon fluid with magnetic particles such as magnetite manufactured by FerroTec Corporation of Nashua, N.H., or iron-nickel metal powders manufactured by Lord Corporation of Cary, N.C. for use in ferrofluids and magnetoresrictive (MR) fluids. Additional ingredients such as surfactants may be included to promote uniform dispersion of the particle. Fluids containing electrically conductive magnetic particles require a mix ratio low enough to ensure that no electrical path can be created in the mixture. Solvents such as formamide inherently posses a relatively high permittivity.

Similar techniques could be used to produce fluidic dielectrics with higher permittivity. For example, fluid permittivity could be increased by adding high permittivity powders such as barium titanate manufactured by Ferro Corporation of Cleveland, Ohio. For broadband applications, the fluids would not have significant resonances over the frequency band of interest.

Controlling the Variable Displacement Processor

Figure 5:
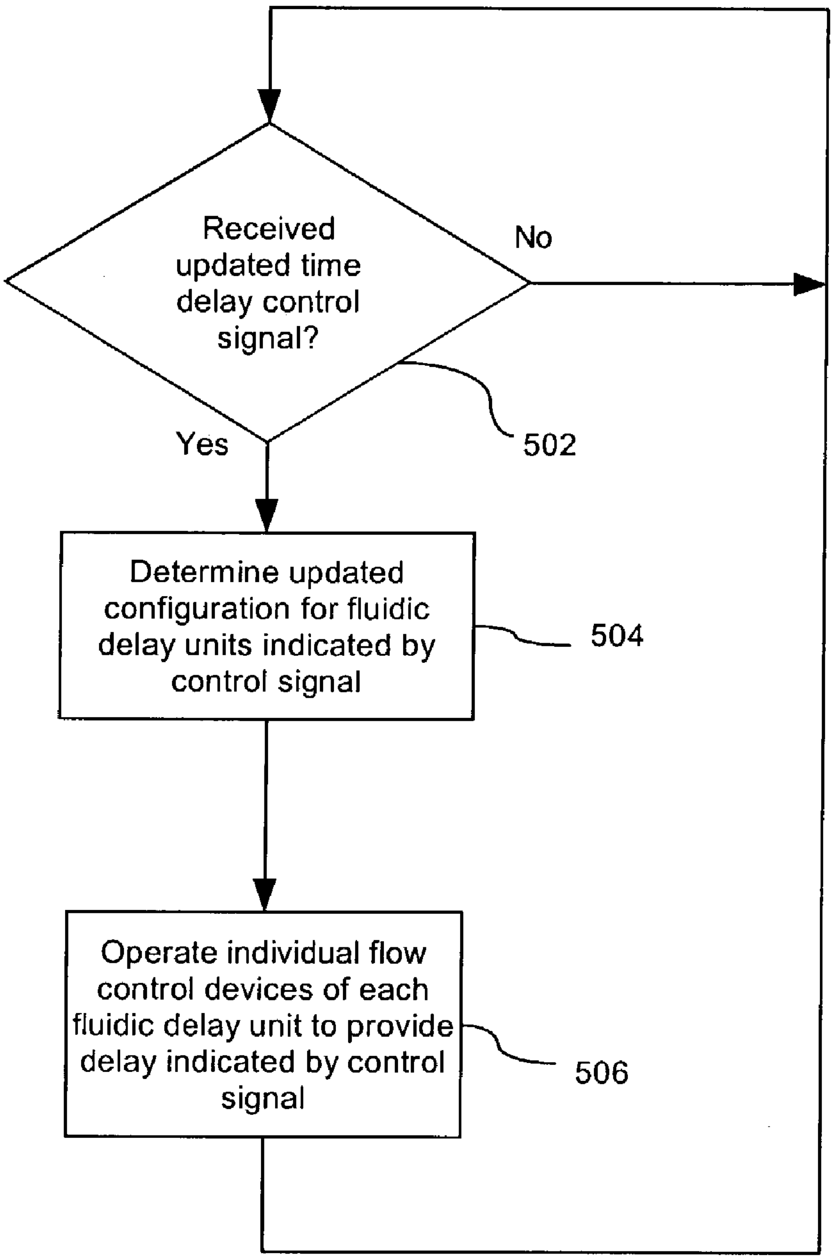
FIG. 5 is a flow chart that is useful for understanding the process of the invention.

FIG. 5 is a flowchart illustrating a process for producing a variable time delay in accordance with a preferred embodiment of the invention. The process can begin in step 502 by controller 136 continually checking the status of an input buffer (not shown) for receiving control signal 137. If the controller determines that an updated time delay control signal has been received on the control signal input line then the controller 136 continues on to step 504. In step 504, the controller 136 can determine the updated configuration for fluidic delay units 108 necessary to implement the time delay indicated by control signal 137. For example, the controller can determine whether fluidic dielectric should be added or removed from each cavity 108 in order to implement the necessary amount of time delay.

According to a preferred embodiment, each cavity 108 can be either made full or empty of fluidic dielectric in order to implement the required time delay. However, the invention is not so limited and it is also possible to only partially fill or partially drain the fluidic dielectric from one or more of the cavities 108.

In either case, once the controller has determined the updated configuration for each of the fluidic delay units necessary to implement the time delay, the controller can move on to step 506. In step 506, the controller operates individual fluid control system 114 of each fluidic delay unit to implement the required delay.

The required configuration of the fluidic delay units 108 can be determined by one of several means. One method would be to calculate the total time delay for the transmission line 110. Given the permittivity and permeability of the fluid dielectrics in cavities 109, and any surrounding solid dielectric 102, 142, the propagation velocity could be calculated for the portions of the transmission line. These values could be calculated each time a new delay time request is received or could be stored in a memory associated with controller 136.

As an alternative to calculating the required configuration of the fluidic delay units, the controller 136 could also make use of a look-up-table (LUT). The LUT can contain cross-reference information for determining control data for fluidic delay units necessary to achieve various different delay times. For example, a calibration process could be used to identify the specific digital control signal values communicated from controller 136 to the fluidic delay units that are necessary to achieve a specific delay value. These digital control signal values could then be stored in the LUT. Thereafter, when control signal 137 is updated to a new requested delay time, the controller 136 can immediately obtain the corresponding digital control signal for producing the required delay.

As an alternative, or in addition to the foregoing methods, the controller 136 could make use of an empirical approach that injects a signal at RF input port 104 and measures the delay to RF output port 106. Specifically, the controller 137 could check to see whether the updated time delay had been achieved. A feedback loop could then be employed to control the fluid control systems 114 to produce the desired delay characteristic.

Those skilled in the art will recognize that a wide variety of alternatives could be used to adjust the presence or absence of the fluid dielectric contained in each of the fluidic delay units 108. Accordingly, the specific implementations described herein are intended to be merely examples and should not be construed as limiting the invention.

RF Unit Structure, Materials and Fabrication

In theory, constant characteristic impedance can be obtained for a transmission line by maintaining a constant ratio of permittivity to permeability in the dielectric to which the line is coupled. Accordingly, in those instances where the transmission line is for all practical purposes coupled exclusively to the fluidic dielectric, then it is merely necessary to maintain a constant ratio of $\epsilon_r/\mu_r$, where $\epsilon_r$ is the permittivity of the fluidic dielectric, and $\mu_r$ is the permeability of the fluidic dielectric.

However, in the case where the transmission line is also partially coupled to a solid dielectric, then the permeability $\mu_r$ necessary to keep the characteristic impedance of the line constant can be expressed as follows:

$$\mu_r=\mu_{r,sub}(\epsilon_r/\epsilon_{r,sub})$$

where $\mu_{r,sub}$ is the permeability of the solid dielectric substrate 142, $\epsilon_r$ is the permittivity of the fluidic dielectric 108 and $\epsilon_{r,sub}$ is the permittivity of the solid dielectric substrate 142. When this condition applies, the effective index describing the velocity of the wave $n_{eff}$, is approximately equal to $n_{O,eff}(\epsilon_r/\epsilon_{r,sub})$ where $n_{O,eff}$ is the index in the solid dielectric substrate.

Note that when the dielectric properties of a transmission line are inhomogeneous along the direction of wave propagation, but the inhomogeneities are small relative to the wavelength in the medium, the line typically behaves like a homogenous line with dielectric properties between the extremes of the inhomogeneous line. Exceptions to this rule may occur when the inhomogeneities are periodic with a period harmonically related to the wavelength. In most other cases, however, inhomogeneous line will generally be characterized by an "effective permittivity" $\epsilon_{r,eff}$ and an "effective permeability" $\mu_{r,eff}$ which are merely the properties of the hypothetical equivalent homogeneous structure. This condition may apply to specific embodiments of the current invention if the fluid cavities illustrated in FIG. 2 are small. In this case, the fluid properties can be chosen to maintain a constant ratio of effective permeability to effective permittivity with respect to the transmission line with empty cavities. This will maintain constant impedance with a variable index of refraction as described above. The scope of the invention is not restricted to transmission lines for which this condition is enforced.

At this point it should be noted that while the embodiment of the invention in FIG. 1–4 is shown essentially in the form of a microstrip or buried microstrip construction, the invention herein is not intended to be so limited. Instead, the invention can be implemented using any type of transmission line by replacing at least a portion of a conventional solid dielectric material that is normally coupled to the transmission line with a fluidic dielectric as described herein. For example, and without limitation, the invention can be implemented in transmission line configurations including conventional waveguides, stripline, microstrip, coaxial lines, and embedded coplanar waveguides. All such structures are intended to be within the scope of the invention.

According to one aspect of the invention, the solid dielectric substrate 102, 142 can be formed from a ceramic material. For example, the solid dielectric substrate can be formed from a low temperature co-fired ceramic (LTCC). Processing and fabrication of RF circuits on LTCC is well known to those skilled in the art. LTCC is particularly well suited for the present application because of its compatibility and resistance to attack from a wide range of fluids. The material also has superior properties of wetability and absorption as compared to other types of solid dielectric material. These factors, plus LTCC's proven suitability for manufacturing miniaturized RF circuits, make it a natural choice for use in the present invention.

We claim:

1. A variable true time delay line, comprising:

an RF transmission line;

a plurality of fluidic delay units spaced apart along a length of said RF transmission line, each said fluidic delay unit comprising a fluidic dielectric, a structure defining a cavity coupled to said RF transmission line along at least a portion of a length of said transmission line, and at least one fluid control system for adding and removing said fluid dielectric to said cavity in response to a time delay control signal;

wherein each of said fluidic delay units is independently operable for adding and removing said fluid dielectric from said cavity of each respective fluid delay unit; and wherein a propagation delay of said RF transmission line is selectively varied by at least one of adding and removing said fluid dielectric from said cavities.

2. The true time delay line according to claim 1 wherein said cavity is in the form of a channel that extends across a length of said transmission line.

3. The true time delay line according to claim 1 wherein said transmission line is also coupled to a solid dielectric substrate material.

4. The true time delay line according to claim 3 wherein an effective index describing the wave velocity of an RF signal on said RF transmission line is varied by adding and removing said fluidic dielectric from said cavity.

5. The true time delay line according to claim 3 wherein said solid dielectric substrate is formed from a ceramic material.

6. The true time delay line according to claim 3 wherein said solid dielectric substrate is formed from a low temperature co-fired ceramic.

7. The true delay according to claim 3 wherein said fluidic dielectric has at least one of a permittivity and a permeability that is different as compared to said solid dielectric substrate.

8. The true time delay line according to claim 3 wherein said fluidic dielectric has a permeability and a permittivity selected for maintaining a constant characteristic impedance along an entire length of said RF transmission line.

9. The true time delay line according to claim 1 wherein said fluidic dielectric is comprised of an industrial solvent.

10. A variable true time delay line, comprising:

an RF transmission line;

at least one fluidic delay unit; said fluidic delay unit comprising a fluidic dielectric, a structure defining a cavity coupled to said RF transmission line along at least a portion of a length of said transmission line, and at least one fluid control system for adding and removing said fluid dielectric to said cavity in response to a time delay control signal;

wherein a propagation delay of said RF transmission line is selectively varied by at least one of adding and removing said fluid dielectric from said cavity; and wherein said fluidic dielectric has a permeability and a permittivity selected for maintaining a constant characteristic impedance along an entire length of said RF transmission line.

11. A variable true time delay line, comprising:

an RF transmission line;

at least one fluidic delay unit; said fluidic delay unit comprising a fluidic dielectric, a structure defining a cavity coupled to said RF transmission line along at least a portion of a length of said transmission line, and at least one fluid control system for adding and removing said fluid dielectric to said cavity in response to a time delay control signal;

wherein a propagation delay of said RF transmission line is selectively varied by at least one of adding and removing said fluid dielectric from said cavity; and wherein said fluidic dielectric is comprised of an industrial solvent that has a suspension of magnetic particles contained therein.

12. The true delay line according to claim 11 wherein said magnetic particles are formed of a material selected from the group consisting of ferrite, metallic salts, and organo-metallic particles.

13. A variable true time delay line, comprising:

an RF transmission line;

a plurality of fluidic delay units spaced apart along a length of said RF transmission line, each said fluidic delay unit comprising a fluidic dielectric, a structure defining a cavity coupled to said RF transmission line along at least a portion of a length of said transmission line, and at least one fluid control system for adding and removing said fluid dielectric to said cavity in response to a time delay control signal;

wherein a propagation delay of said RF transmission line is selectively varied by at least one of adding and removing said fluid dielectric from said cavities; and wherein said fluid dielectric contained in at least one of said plurality of fluidic delay units has electrical properties different from at least one other of said plurality of fluidic delay units.

14. A method for producing a variable delay for an RF signal comprising the steps of:

propagating said RF signal along an RF transmission line;

dynamically varying a position of a fluidic dielectric to selectively control a coupling of said fluidic dielectric to said RF transmission line and vary a propagation delay of said transmission line; and wherein said dynamically varying step further comprises at least one of adding and removing said fluidic dielectric from selected ones of a plurality of cavity structures coupled to said RF transmission line along said length thereof in response to a time delay control signal.

15. The method according to claim 14 further comprising the step of selecting a geometry of at least one structure defining a cavity so that said cavity defines a channel traversing beneath a length of said transmission line.

16. The method according to claim 14 further comprising the step of also coupling said RF transmission line to a solid dielectric substrate material.

17. The method according to claim 16 further comprising the step of varying the effective index describing the wave velocity of an RF signal on said RF transmission line by adding and removing said fluidic dielectric from said cavity.

18. The method according to claim 16 further comprising the step of forming said solid dielectric substrate from a ceramic material.

19. The method according to claim 16 further comprising the step of selecting a material for said solid dielectric substrate to be a low temperature co-fired ceramic.

20. The method according to claim 16 further comprising the step of selecting said fluidic dielectric to have at least one of a permittivity and a permeability that is different as compared to said solid dielectric substrate.

21. The method according to claim 17 further comprising the step of selecting said fluidic dielectric to have at least one of a permeability and a permittivity selected for maintaining a constant characteristic impedance along a length of said RF transmission line.

22. The method according to claim 14 further comprising the step of selecting a material for said fluidic dielectric to include an industrial solvent.

23. A method for producing a variable delay for an RF signal comprising the steps of:

propagating said RF signal along an RF transmission line;

dynamically varying a position of said fluidic dielectric to selectively control a coupling of said fluidic dielectric to said RF transmission line and vary a propagation delay of said transmission line; and selecting a permeability and a permittivity for said fluidic dielectric for maintaining a constant characteristic impedance along an entire length of said RF transmission line.

24. A method for producing a variable delay for an RF signal comprising the steps of:

propagating said RF signal along an RF transmission line;

dynamically varying a position of a fluidic dielectric to selectively control a coupling of said fluidic dielectric to said RF transmission line and vary a propagation delay of said transmission line; and selecting a material of said fluidic dielectric to include an industrial solvent that has a suspension of magnetic particles contained therein.

25. The method according to claim 24 further comprising the step of selecting said magnetic particles from the group consisting of ferrite, metallic salts, and organo-metallic particles.

* * * * *